United States Patent
Oung et al.

(10) Patent No.: US 10,210,298 B2
(45) Date of Patent: Feb. 19, 2019

(54) EMBEDDED MEMORY BLOCKS WITH ADJUSTABLE MEMORY BOUNDARIES

(71) Applicant: Altera Corporation, San Jose, CA (US)

(72) Inventors: Kar Liang Oung, Seberang Perai Selatan (MY); Woi Jie Hooi, Sitiawan (MY)

(73) Assignee: Altera Corporation, San Jose, CA (US)

( * ) Notice: Subject to any disclaimer, the term of this patent is extended or adjusted under 35 U.S.C. 154(b) by 442 days.

(21) Appl. No.: 14/951,352

(22) Filed: Nov. 24, 2015

(65) Prior Publication Data

US 2017/0147226 A1    May 25, 2017

(51) Int. Cl.
*G06F 12/02*      (2006.01)
*G06F 17/50*      (2006.01)
*H03K 19/177*     (2006.01)
*G06F 3/06*       (2006.01)

(52) U.S. Cl.
CPC ........ *G06F 17/5054* (2013.01); *G06F 3/0629* (2013.01); *G06F 12/0246* (2013.01); *H03K 19/1776* (2013.01); *G06F 2212/7206* (2013.01)

(58) Field of Classification Search
None
See application file for complete search history.

(56) References Cited

U.S. PATENT DOCUMENTS

| | | | |
|---|---|---|---|
| 5,995,415 A | 11/1999 | Kuo et al. | |
| 6,614,685 B2 | 9/2003 | Wong | |
| 6,634,017 B2 * | 10/2003 | Matsui | G06F 17/5022 716/102 |
| 7,355,441 B1 * | 4/2008 | Agrawal | H03K 19/17728 326/38 |
| 7,474,559 B1 * | 1/2009 | Lakkapragada | G11C 16/08 326/38 |
| 7,495,970 B1 * | 2/2009 | Tang | G11C 29/028 326/39 |
| 8,813,018 B1 * | 8/2014 | Gamsa | G06F 17/5045 716/101 |

(Continued)

OTHER PUBLICATIONS

"POF (Programmer Object File) Format, Code 14", http://www.pldtool.com/pdf/fmt_pof.pdf, Retrieved Jul. 9, 2018.*

*Primary Examiner* — Nicholas J Simonetti

(57) ABSTRACT

An integrated circuit for configuring memory block portions is provided. The integrated circuit may include a memory block that is partitioned into first and second memory block portions. The first memory block portion has a first memory type and the second memory block portion has a second memory type that is different than the first memory type. The integrated circuit further includes a control circuit configured to receive configuration data. The configuration data may include memory partition information for repartitioning the first and second memory block portions into first and second repartitioned memory block portions when a portion of the first memory block portion is unused. The memory partition information may also include a memory partitioning constraint, which includes a start point address for the second repartitioned memory block portion and a number of at least one memory segments to be partitioned in the second repartitioned memory block portion.

20 Claims, 10 Drawing Sheets

(56) References Cited

U.S. PATENT DOCUMENTS

| | | |
|---|---|---|
| 2006/0095648 A1 | 5/2006 | Yuan et al. |
| 2009/0070523 A1 | 3/2009 | Kim et al. |
| 2012/0089765 A1 | 4/2012 | Huang et al. |
| 2014/0108708 A1 | 4/2014 | Borchers et al. |
| 2014/0156915 A1 | 6/2014 | Borchers et al. |

* cited by examiner

EMBEDDED MEMORY BLOCKS WITH ADJUSTABLE MEMORY BOUNDARIES

BACKGROUND

Programmable devices, such as FPGAs, typically include thousands of programmable logic cells that use combinations of logic gates and/or look-up tables to perform logic operations. Programmable devices also include a number of functional blocks having specialized logic devices adapted to specific logic operations, such as adders, multiply and accumulate circuits, phase-locked loops, and embedded memory blocks.

Embedded memory blocks may be important components in programmable devices. Embedded memory blocks can allow for bulk data storage within the device without the need for time-consuming off-device memory accesses. In some programmable devices, the embedded memory blocks may be organized into two different memory types, such as configuration flash memory (CFM) and user flash memory (UFM). In these devices, the CFM is used to store configuration bit streams (also referred to as configuration bits or configuration data) that are used to configure an IC device. The UFM is used to store user data and other information. In a conventional embedded memory scheme where memory capacity is fixed, a preset amount of memory may be allocated to CFM and UFM.

However, in some instances, configuration data may be compressed to reduce memory storage requirements and configuration time. A compression ratio may be used in order to determine the amount of memory required to store the configuration bits in the CFM. Because different circuit designs will have different configuration bits, compression ratios for the configuration bits may vary. This variability, however, may result in under-utilized memory within the preset-size CFM, which wastes memory resource space that could be used as additional UFM storage.

SUMMARY

In accordance with the present invention, apparatuses and method are provided for configuring embedded memory blocks with adjustable memory boundaries.

It is appreciated that the present invention can be implemented in numerous ways, such as a process, an apparatus, a system, or a device. Several inventive embodiments of the present invention are described below.

An integrated circuit is provided. The integrated circuit includes a memory block that is partitioned into first and second memory block portions. The first memory block portion includes memory elements of a first memory type. The second memory block portion includes memory elements of a second memory type. For example, the first memory type is configuration flash memory, and the second memory type is user flash memory. A control circuit is configured to receive configuration data that includes memory partitioning information for repartitioning the memory block into first and second repartitioned memory block portions. The partition information memory may include information on unused memory derived from the first memory block portion during a design compilation operation of the integrated circuit. The unused memory may be removed from the first memory block portion and allocated to the second memory block portion. Such a configuration forms the first and second repartitioned memory block portions, whereby the first repartitioned memory block portion includes the first memory block portion minus the unused memory, and the second repartitioned memory block portion includes the second memory block portion and the unused memory.

A method for using a computer-aided design tool implemented on computing equipment to configure an integrated circuit device having a memory block that is divided into a first memory block portion and a second memory block portion is provided. The method includes generating configuration data for the integrated circuit device and compressing the configuration data. It is then determined whether unused memory is present in the first memory block by analyzing the compressed configuration data. In response to the determination, the memory capacity of each of the first memory block portion and the second memory block portion is adjusted. The second memory block portion is then partitioned based on a user input that specifies a memory partition constraint for the second memory block portion.

Another method for configuring an integrated circuit is provided. This method includes receiving custom logic design data for the integrated circuit having a memory block that is partitioned into a first portion of a first memory type and a second portion of a second memory type that is different than the first memory type. An amount of unused memory in the first portion of the memory block is determined by analyzing the custom logic design. In response to determining that the amount of unused memory exceeds a predetermined threshold, the memory block is repartitioned into a first repartitioned portion of the first memory type and a second repartitioned portion of the second memory type.

Further features of the invention, its nature and various advantages, will be more apparent from the accompanying drawings and the following detailed description of the preferred embodiments.

DETAILED DESCRIPTION

The embodiments provided herein include apparatuses and method for configuring embedded memory blocks with adjustable memory boundaries.

It will be obvious, however, to one skilled in the art, that the present exemplary embodiments may be practiced without some or all of these specific details. In other instances, well-known operations have not been described in detail in order not to obscure unnecessarily the present embodiments.

Figure 1:
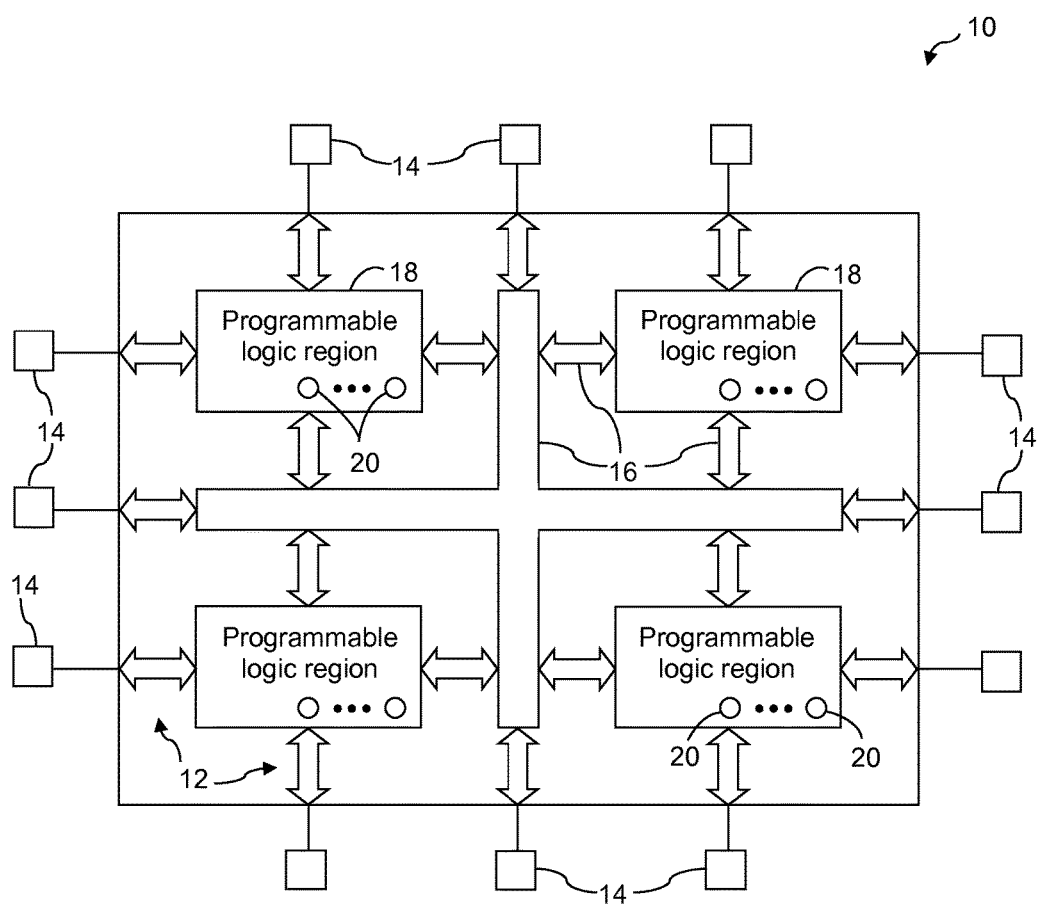
FIG. 1 is a diagram of an illustrative integrated circuit in accordance with an embodiment of the present invention.

FIG. 1 is a diagram of an illustrative integrated circuit 10 in accordance with an embodiment of the present invention. Integrated circuit 10 has input-output (IO) circuitry 12 for driving signals off of integrated circuit 10 and for receiving signals from other circuits or devices via IO pins 14. Interconnection resources 16 such as global and local vertical and horizontal conductive lines and busses may be used to route signals on integrated circuit 10. Interconnection resources 16 include fixed interconnects (conductive lines) and programmable interconnects (e.g., programmable connections between respective fixed interconnects). The programmable interconnects associated with interconnection resources 16 may be considered to be a part of programmable logic regions 18.

Memory elements 20 may be formed using complementary metal-oxide-semiconductor (CMOS) integrated circuit technology (as an example). In the context of programmable integrated circuit device, memory elements 20 may store configuration data and are therefore sometimes referred to as configuration random-access memory (CRAM) cells. In general, configuration random-access memory elements 20 may be arranged in an array pattern. A user (e.g., a logic designer) may provide configuration data for the array of memory elements during programming operation. Once loaded with configuration data, memory elements 20 may selectively control (e.g., turn on and off) portions of the circuitry in programmable logic regions 18 and thereby customize its functions as desired.

The circuitry of integrated circuit 10 may be organized using any suitable architecture. For example, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

Horizontal and vertical conductors and associated control circuitry may be used to access memory elements 20 when memory elements 20 are arranged in an array. The control circuitry, for example, may be used to clear all or some of the memory elements. The control circuitry may also write data to memory elements 20 and may read data from memory elements 20. Memory elements 20 may be loaded with configuration data, for instance, in CRAM arrays. The loaded configuration data may then be read out from the memory array to confirm proper data capture before integrated circuit 10 is used during normal operation in a system.

Figure 2:
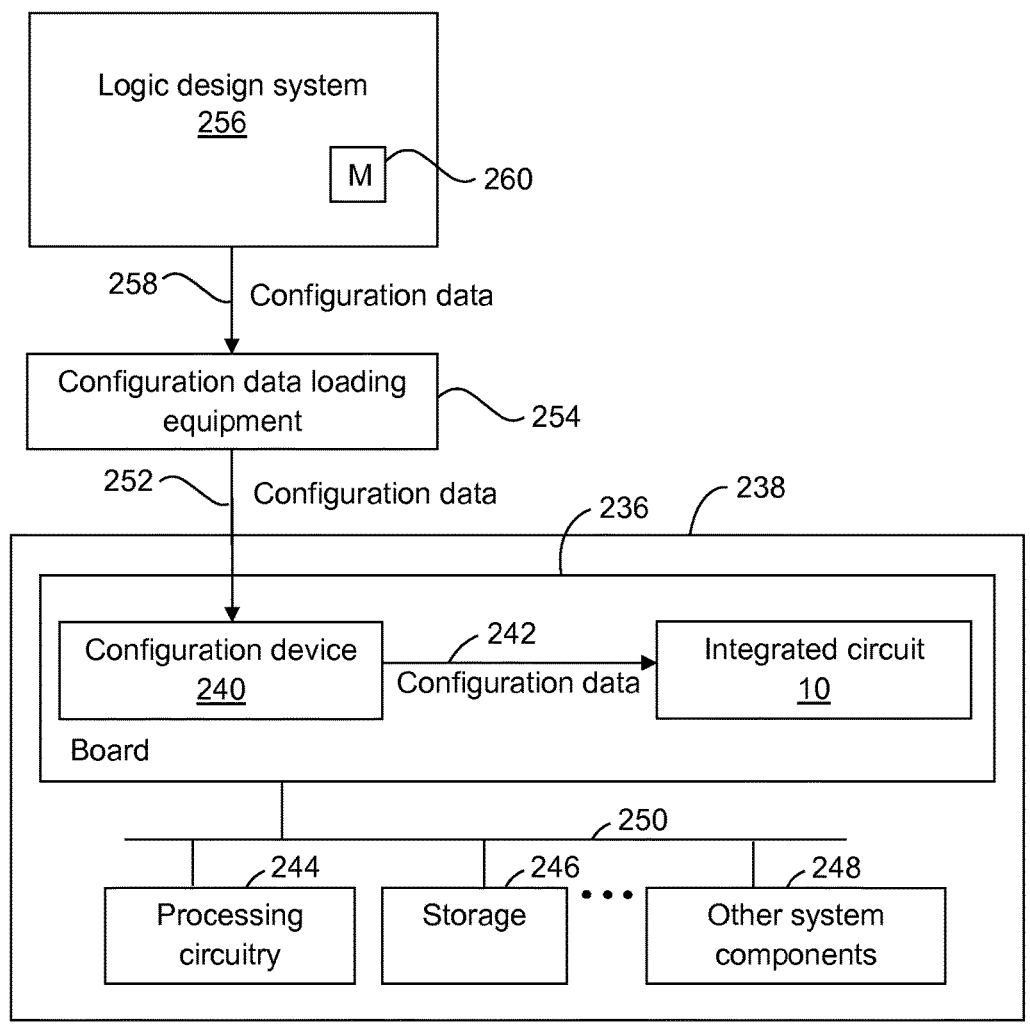
FIG. 2 is a diagram of an illustrative system environment in which an integrated circuit may be configured using a logic design system in accordance with an embodiment of the present invention.

An illustrative system environment for designing and configuring integrated circuit 10 is shown in FIG. 2. Integrated circuit 10 may be mounted on circuit board 236 in system 238. Integrated circuit 10 may receive configuration data from programming equipment or from any other suitable equipment or device.

In the example of FIG. 2, integrated circuit 10 is a type of programmable integrated circuit that receives configuration data from an associated integrated circuit such as configuration device 240. With this type of arrangement, configuration device 240 may, if desired, be mounted on the same circuit board 236 as integrated circuit 10. Configuration device 240 may be a programmable logic device configuration data loading chip that loads configuration data into programmable logic device memory from an external electrically erasable-programmable read-only memory (EEPROM) chip, a programmable logic device configuration data loading chip with built-in memory (sometimes referred to as a configuration device), or any other suitable device. When system 238 boots up (or at another suitable time), the configuration data may be supplied to integrated circuit 10 from configuration device 240, as shown schematically by path 242. The configuration data that is supplied to integrated circuit 10 may be stored in its programmable memory elements 20 (e.g., configuration random-access-memory elements).

System 238 may include processing circuitry 244, storage 246, and other system components 248 that communicate with integrated circuit 10. The components of system 238 may be mounted on circuit board 236 or other suitable mounting structures or housings and may be interconnected by busses and other electrical paths 250.

Configuration device 240 may be supplied with the configuration data for integrated circuit 10 over a path such as path 252. Configuration device 240 may, for example, receive the configuration data from configuration data loading equipment 254 or other suitable equipment. Configuration device 240 may be loaded with data before or after installation on circuit board 236.

It can be a significant undertaking to design and implement a desired logic circuit in a programmable logic device. Logic designers therefore generally use logic design systems based on computer-aided-design (CAD) tools to assist them in designing circuits. A logic design system (sometimes referred to as a circuit design system) can help a logic designer design and test complex circuits for a system. When a design is complete, the logic design system may be used to generate configuration data for electrically programming the appropriate programmable logic device. The logic design system may be implemented on computing equipment.

As shown in FIG. 2, the configuration data produced by logic design system 256 may be provided to equipment 254 over a path such as path 258. Equipment 254 provides the configuration data to device 40 so that device 240 can later provide this configuration data to device 10 over path 242. System 256 may be based on one or more computers and one or more software programs.

In a typical scenario, logic design system 256 is used by a logic designer to create a custom circuit design. System 256 produces corresponding configuration data which is provided to configuration device 240. Upon power-up, configuration device 240 and data loading circuitry on integrated circuit 10 is used to load the configuration data into the programmable memory elements 20 of integrated circuit 10. Integrated circuit 10 may then be used in normal operation of system 238.

Figure 3:
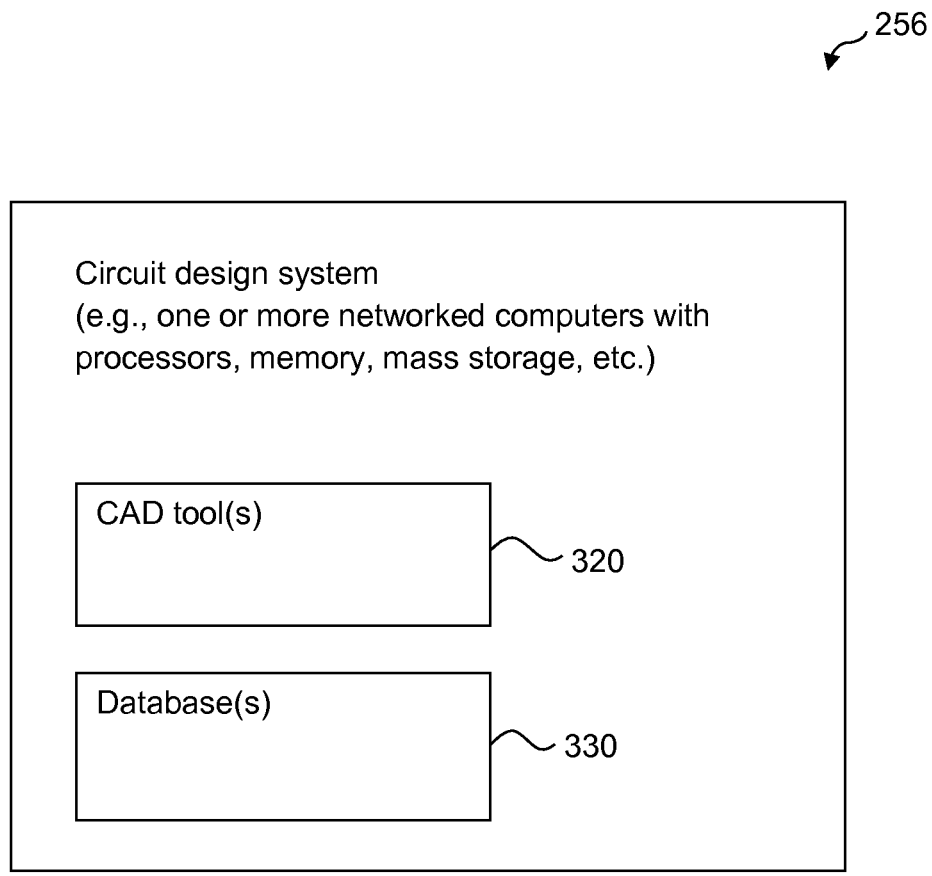
FIG. 3 is a diagram of a logic design system for generating configuration data for implementing custom circuit designs in programmable integrated circuits in accordance with an embodiment of the present invention.

An illustrative logic design system 256 in accordance with the present invention is shown in FIG. 3. System 256 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 320 and databases 330 reside on system 256. During operation, executable software such as the software of computer aided design tools 330 runs on the processor(s) of system 300. Databases 330 are used to store data for the operation of system 256. In general, software and data may be stored on any computer-readable medium (storage) in system 256. Such storage, which is shown schematically as storage 260 of FIG. 2, may include computer memory chips, removable and fixed media such as hard disk drives, flash memory, compact discs (CDs), DVDs, other optical media, and floppy diskettes, tapes, or any other suitable memory or storage device(s). When the software of system 256 is installed, storage 260 of system 256 has instructions and data that cause the computing equipment in system 256 to execute various methods (processes). When performing these processes, the computing equipment is configured to implement the functions of the logic design system.

The computer aided design (CAD) tools 320, some or all of which are sometimes referred to collectively as a CAD tool, may be provided by a single vendor or multiple vendors. Tools 320 may be provided as one or more suites of tools (e.g., a compiler suite for performing tasks associated with implementing a circuit design in a programmable logic device) and/or as one or more separate software components (tools). Database(s) 330 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

Figure 4:
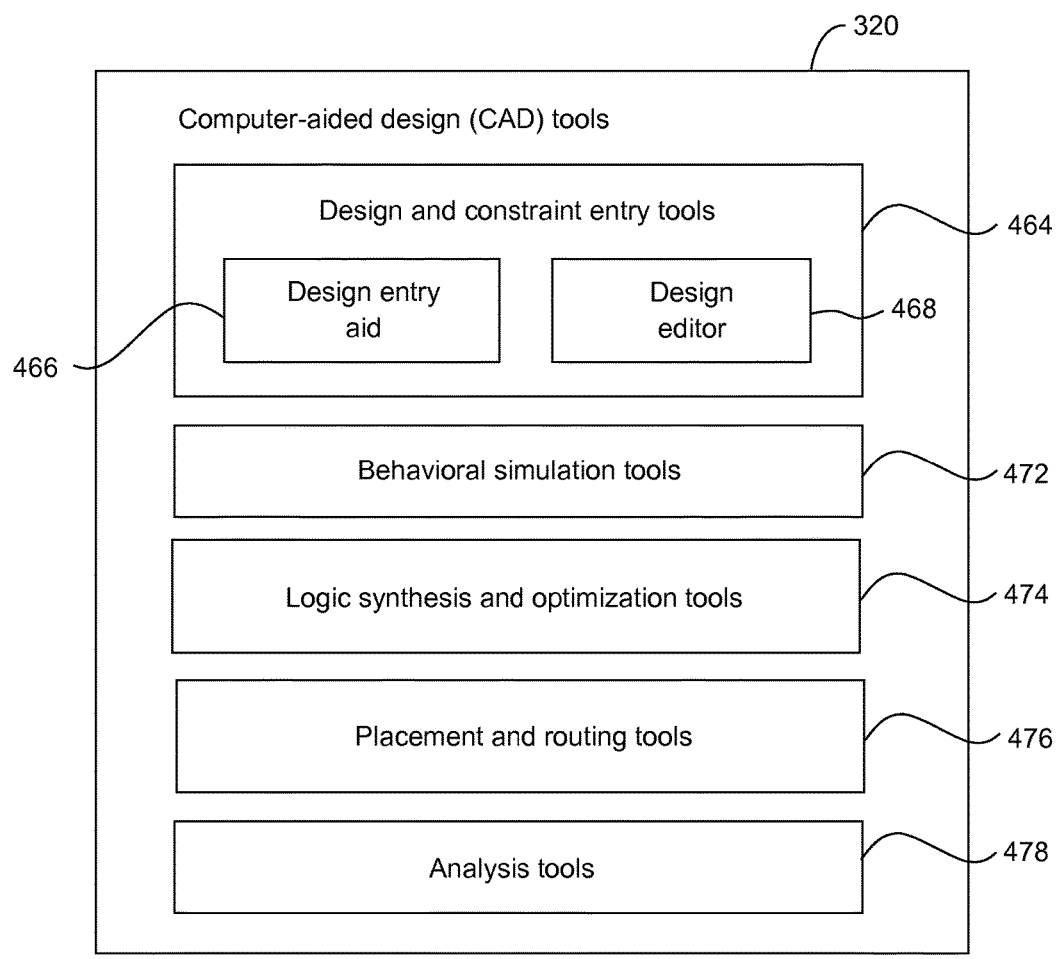
FIG. 4 is a diagram of illustrative integrated circuit having a controller and a core logic circuit in accordance with an embodiment of the present invention.

Illustrative computer aided design tools 320 that may be used in a logic design system such as system 256 of FIGS. 2 and 3 are shown in FIG. 4.

The design process typically starts with the formulation of logic circuit functional specifications (e.g., a functional description of the logic circuit). A logic designer can specify how a desired circuit should function using design and constraint entry tools 464. Design and constraint entry tools 464 may include tools such as design and constraint entry aid 466 and design editor 468. Design and constraint entry aids such as aid 466 may be used to help a logic designer locate a desired design from a library of existing logic designs and may provide computer-aided assistance to the logic designer for entering (specifying) the desired design.

As an example, design and constraint entry aid 466 may be used to present screens of options for a user. The user may click on on-screen options to select whether the circuit being designed should have certain features. Design editor 468 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 464 may be used to allow a logic designer to provide a desired logic design using any suitable format. For example, design and constraint entry tools 464 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 464 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 464 may allow the logic designer to provide a logic design to the logic design system 256 using a hardware description language such as Verilog hardware description language (HDL) or Very High Speed Integrated Circuit Hardware Description Language (VHDL). The designer of the logic circuit can enter the logic design by writing hardware description language code with editor 468. Blocks of code may be imported from user-maintained or commercial libraries if desired.

After the design has been entered using design and constraint entry tools 464, behavioral simulation tools 472 may be used to simulate the functional performance of the design. If the functional performance of the design is incomplete or incorrect, the logic designer can make changes to the design using design and constraint entry tools 464. The functional operation of the new design can be verified using behavioral simulation tools 472 before synthesis operations have been performed using logic synthesis and optimization tools 474. Simulation tools such as tools 472 may also be used at other stages in the design flow if desired (e.g., after logic synthesis). The output of the behavioral simulation tools 472 may be provided to the logic designer in any suitable format (e.g., truth tables, timing diagrams, etc.).

Once the functional operation of the logic design has been determined to be satisfactory, tools 474 may be used to implement the logic design in a particular programmable logic device (i.e., in the logic and interconnect resources of a particular programmable logic device product or product family).

Tools 474 attempt to optimize the design by making appropriate selections of hardware to implement different logic functions in the logic design based on the logic design data and constraint data entered by the logic designer using tools 464.

After logic synthesis and optimization using tools 474, the logic design system may use tools such as placement and routing tools 476 to perform physical design steps (layout synthesis operations). Placement and routing tools 476 are used to determine how to place the circuits for each logic function within the programmable logic device. For example, if two counters interact with each other, the placement and routing tools 476 may locate these counters in adjacent logic regions on the programmable logic device to reduce interconnect delays or to satisfy timing requirements specifying the maximum permitted interconnect delay. The placement and routing tools 476 create orderly and efficient implementations of logic designs for a given programmable logic device.

Tools such as tools 474 and 476 may be part of a compiler suite (e.g., part of a suite of compiler tools provided by a programmable logic device vendor). In accordance with the present invention, tools such as tools 474, 476, and 478 may automatically take into account the effects of crosstalk between interconnects while implementing a desired circuit design. Tools 474, 476, and 478 may also include timing analysis tools. This allows tools 474 and 476 to satisfy performance requirements (e.g., timing requirements) when generating configuration data for programming integrated circuits such as integrated circuit 10 of FIG. 1.

After an implementation of the desired logic design in the programmable logic device has been generated using placement and routing tools 476, the implementation of the design may be analyzed and tested using analysis tools 478. After satisfactory optimization operations have been completed using tools 320, tools 320 can produce the configuration data for the programmable logic device.

Figure 5:
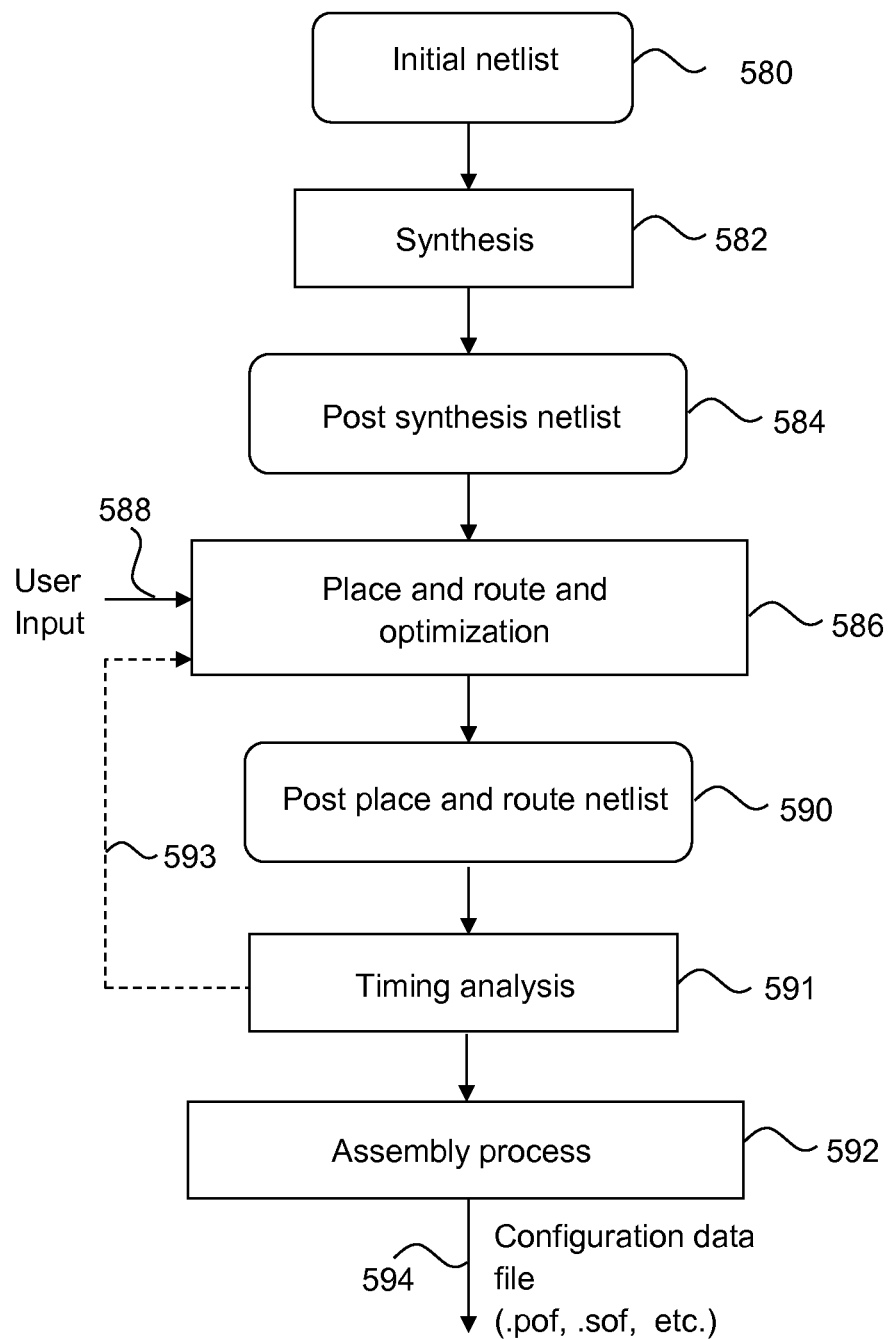
FIG. 5 is a flow chart of illustrative steps for designing a custom logic circuit and performing timing analysis in accordance with an embodiment of the present invention.

Illustrative operations involved in using tools 320 of FIG. 4 to produce configuration data files are shown in FIG. 5. As shown in FIG. 5, an initial netlist 580 is synthesized at step 582 to produce a post-synthesis netlist 84. At step 586, user input 588 and the post synthesis netlist 584 are processed during place and route and optimization operations. During the operations of step 586, tools 320 take account of the effects of using different positive power supply voltages and/or body bias voltages and, through appropriate selection of power supply and body bias levels, circuit resource assignments, and placement decisions, tools 320 reduce power consumption while satisfying design constraints.

The resulting netlist 590 may be processed further by performing a timing analysis using logic design system 256 (step 591). The timing analysis may be used to help ensure that the final netlist 590 satisfies timing constraints before configuring integrated circuit 10 of FIG. 1. If desired, processing may optionally loop back to step 586 via path 593 to perform additional optimizations using the final netlist. For example, logic design system 256 may identify routing paths in the final netlist that fail timing constraints and determine replacement routing paths by returning to step 586 via optional path 593.

At step 592, the final netlist may be processed further during an assembly process to produce a configuration data file output (e.g., a .pof or .sof file). The configuration data file output may then be loaded onto integrated circuit 10.

Figure 6A:
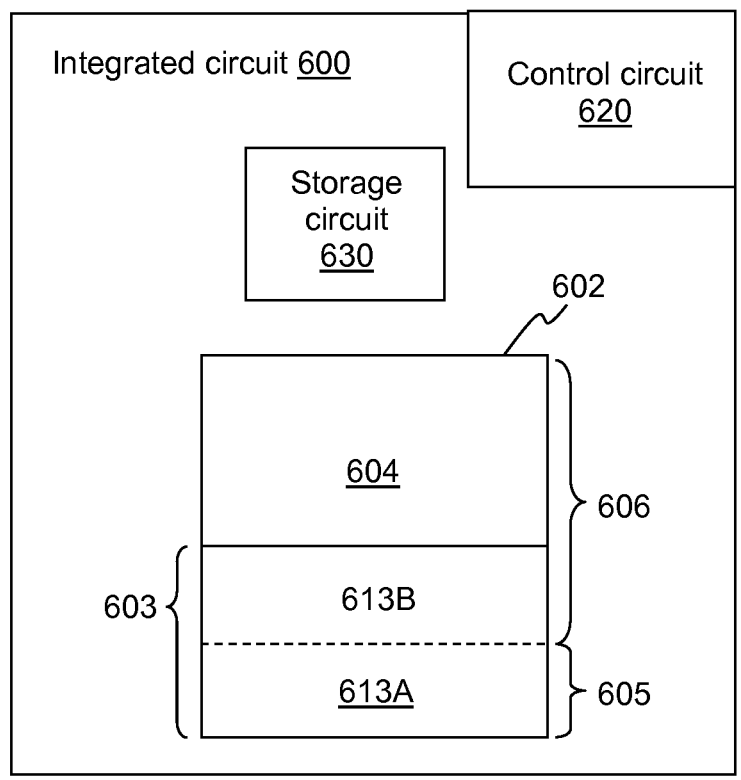
FIG. 6A is a diagram of an illustrative integrated circuit having a memory block with two memory block portions in accordance with an embodiment of the present invention.

FIG. 6A shows a diagram of illustrative integrated circuit 600 having memory block 602 with two memory block portions 603 and 604 in accordance with an embodiment of the present invention. Integrated circuit 600 may be a programmable logic device (PLD) such as a field programmable gate array (FPGA) device. Alternatively, integrated circuit 600 may be a multi-chip module device. As shown in FIG. 6A, integrated circuit 600 may include memory block 602, control circuit 620, and storage circuit 630. In one embodiment, memory block 602 is an embedded non-volatile memory block placed within integrated circuit 600. Memory block 602 may have a fixed size. For example, memory block 602 may have a fixed memory capacity of 4K (i.e., 4096) word blocks. It should be noted that when the memory has a 4 k word size, addressing must be made on at least 12 bits.

As shown in FIG. 6A, memory block 602 is partitioned into two memory block portions (e.g., memory block portions 603 and 604). Each memory block portion may be referred to as virtual memory, and may be aligned or mapped to a virtual memory boundary. For example, each of memory block portions 603 and 604 is 2K word in virtual memory boundary size and has a different memory type. The term "memory type", as used herein, refers to types of memory used for different purposes and/or for different kinds of data. For example, memory block portion 603 may be implemented to serve as configuration flash memory (CFM) for storing configuration bits, whereas memory block portion 604 may be implemented to serve as user flash memory (UFM) for storing user data. It is noted that memory block portion 603 and CFM 603 are used interchangeably in the description and they mean the same. Similarly, memory block portion 604 and UFM 604 are used interchangeably in the description.

Control circuit 620 may receive configuration data file output (or configuration data) to configure integrated circuit 600. The configuration data output may be stored in CFM 603 during the configuration of integrated circuit 600. In some scenarios, the configuration data file output may be compressed to save configuration memory space and also to reduce storage requirements in the integrated circuit. However, depending on a compression ratio used to compress the configuration bits, the compressed configuration bits may only require a portion (e.g., memory portion 613A) of memory block portion 603 for storage. In a typical system, the remaining memory portion 613B may be unused. As a person skilled in the art knows, unused memory is typically regarded as wasted memory.

Therefore, a flexible memory analysis mechanism may be used to ensure that all the memory, including the unused memory, in the memory block is fully utilized to prevent wasting valuable memory resource. The memory analysis mechanism, which will be described in detail below, analyzes the compressed configuration data file output for unused memory in memory block portion 603, and dynamically adjusts the memory boundaries between memory block portions 603 and 604. For example, if an amount of unused memory (e.g., memory portion 613B) is present in memory block portion 603, the unused memory may then be dynamically allocated to memory block portion 604 from memory block portion 603 to ensure that memory portion 613B is utilized as part of the UFM. To do so, the memory size/memory capacity of each of memory block portions 603 and 604 may be adjusted by changing the start address and end address of each memory block portion in memory block 602 accordingly to the allocation of the unused memory in memory block 602. Such a configuration may result in memory block 602 being repartitioned into memory block portions 605 and 606. For example, memory block portion 605 may include memory portion 613A (which stores the compressed configuration bits), and memory block portion 606 may include memory block portion 604 and unused memory portion 613B of memory block portion 603. Subsequently, the address of memory block portion 605 and 606 is stored in sequence in storage circuit 630. For example, storage circuit 630 may be a register or a cache memory in integrated circuit 600.

Figure 6B:
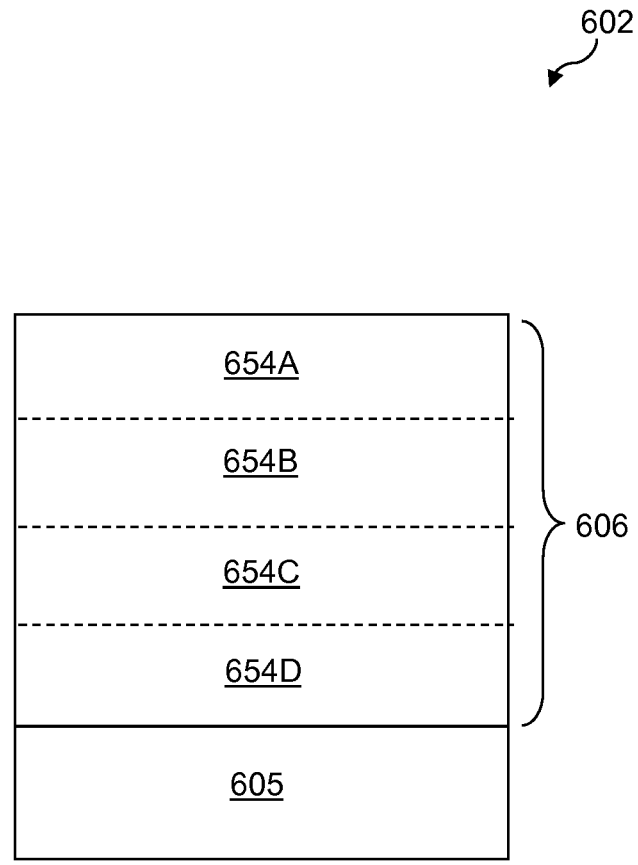
FIG. 6B is a detailed diagram of a memory block of an integrated circuit shown in FIG. 6A in accordance with an embodiment of the present invention.

The flexible memory analysis mechanism may also facilitate the partitioning of UFM 606 based on user requirements. FIG. 6B shows a detailed diagram of memory block 602 of integrated circuit 600 of FIG. 6A in accordance with an embodiment of the present invention. As described above, memory block 602 may be repartitioned into memory block portions 605 and 606 when unused memory (e.g., memory portion 613B) is present in memory block 602. In one embodiment, UFM 606 may be configured into partitioned memory segments based on a memory partitioning constraint provided by a user. For example, the memory partitioning constraint may include a start address (or entry point address) for UFM 606 and a number of memory segments to be partitioned in UFM 606. For example, UFM block portion 606 may be partitioned into four memory segments (e.g., UFM segments 654A, 654B, 654C, and 654D), with a user-defined size applied to each or all of the memory segments.

Alternatively, each memory segment may utilize a system default size if not specified by the user. The size of each memory segment may be addressable by a memory segment address range (i.e., a start address and an end address) which is defined in sequence by the start memory address of UFM 606. The memory segment address range of each partitioned memory segment may then be stored in storage circuit 630 of FIG. 6A. Once the integrated circuit device is configured, the memory configuration mechanism, which will be described in detail below, is activated to ensure that memory block 602 is fully utilized to prevent memory resource wastage.

Figure 7:
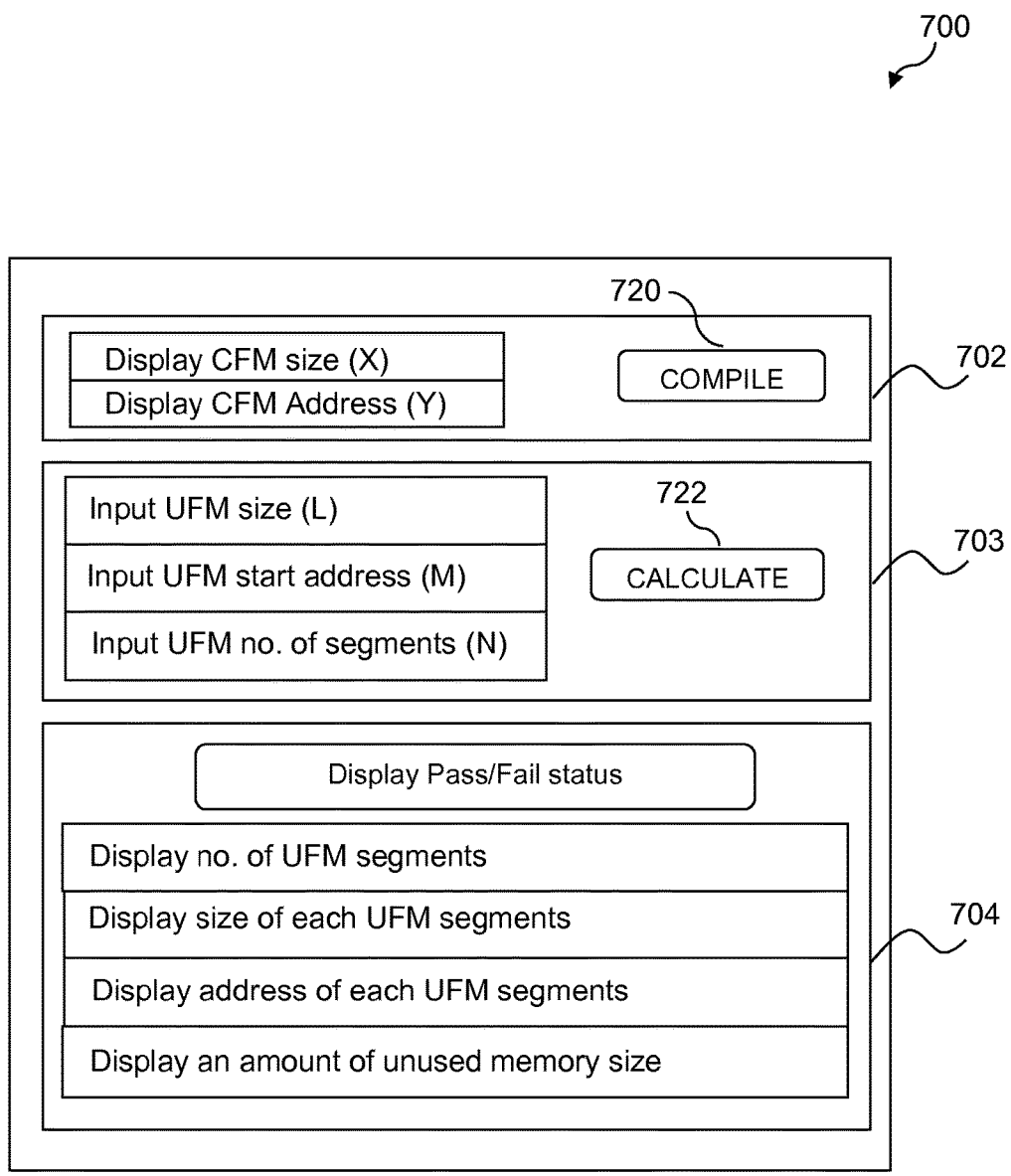
FIG. 7 is a diagram of an illustrative memory analyzer tool for modifying memory block portions in a memory block in accordance with an embodiment of the present invention.

In order to enable memory size configuration in an integrated circuit, a compressed custom logic design may be analyzed for its memory requirement. FIG. 7 is an illustrative memory analyzer tool 700 that can be used for this purpose. Memory analyzer tool 700 may be implemented as a part of design and constraint entry tools 464 of FIG. 4 or may be implemented separately. It should be appreciated that the embodiment of FIGS. 6A and 6B may be used as examples to explain the functionality of memory analyzer tool 700.

As shown in FIG. 7, memory analyzer tool 700 may include CFM compiler tool 702, UFM specification tool 703, and display 704. As used herein, the term "CFM" refers configuration flash memory (e.g., memory block portions 603 and 605). The term "UFM" refers to user flash memory (e.g., memory block portions 604 and 606). In one embodiment, CFM compiler tool 702 may be used to determine the size of CFM, X, and address of the CFM, Y, based on a custom logic design. For example, CFM compiler tool 700 may perform a compilation (e.g., using COMPILE function 720) on the configuration data to compile the custom logic design in order to generate a compressed full configuration data. The compressed version of the full configuration data may determine the CFM size needed for storing configuration data of the custom logic design and the CFM address. As shown in FIG. 7, the results of the compilation are displayed to indicate the final CFM size and address.

For example, in the embodiments of FIG. 6A, each of memory block portions 603 and 604 in memory block 602 may have a fixed size of 2K word. When a user design is compiled using tool 702, a compressed configuration data file output is generated. Assuming that the compressed configuration data only requires 1K word of space (represented by memory portion 613A) in memory block portion 603, memory block portion 603 would have an unused memory of 1K word size (represented by memory portion 613B).

Based on this information, the memory size (or address boundary) of memory block portions 603 and 604 can be adjusted by allocating the unused memory (e.g., memory portion 613B of FIG. 6A) in memory block portion 603 to memory block portion 604. For example, the start address and end address of each memory block portion 603 and 604 may be changed according to the allocation of unused memory portion 613B. As such, memory block 602 is repartitioned into two memory block portions (e.g., memory block portions 605 and 606).

Memory block portion 605 (or CFM 605) may represent the final CFM size required to store the compressed configuration data file output, and memory block portion 606 (or UFM 606) may represent the final UFM size available to store user information. For example, memory block portion 605 has a size of 1K word (i.e., a total size of memory portion 613A), and memory block portion 606 has a size of 3K word (i.e., a total size of the combined unused memory portion 613B and memory block portion 604), respectively.

The newly-formed memory block portion 606 may be further configured into partitioned memory segments (or UFM segments). In one embodiment, memory analyzer tool 700 may receive a user input via UFM specification tool 703, which may specify a memory partitioning constraint for memory block portion 606 based on the displayed memory information on memory block portion 605. For example, the memory partition constraint may include inputs for UFM size (L), UFM start address (M), and a number of memory segments (N) to be partitioned in memory block portion 606. The provided input information is then evaluated (e.g., using CALCULATE function 722) to determine whether the provided information meets the available memory requirement of memory block 602.

After evaluation, the results of the evaluation test will be displayed on display 704 with a PASS or FAIL status. If a PASS is displayed, it means that the provided input met the available memory requirement. If a FAIL is displayed, the user may be presented with an opportunity to enter another memory partitioning constraint for memory block portion 604 to be evaluated again. As shown in FIG. 7, the results of the evaluation may include the number of UFM memory segments, the size of each UFM segments, memory segment address range (i.e., start address and end address) of each UFM segments, and an amount of unused memory size available in the UFM. After satisfactory memory configuration operations have been completed using memory analyzer tool 700, tool 700 can produce the configuration data, including the memory partitioning information data, for integrated circuit 600.

Figure 8:
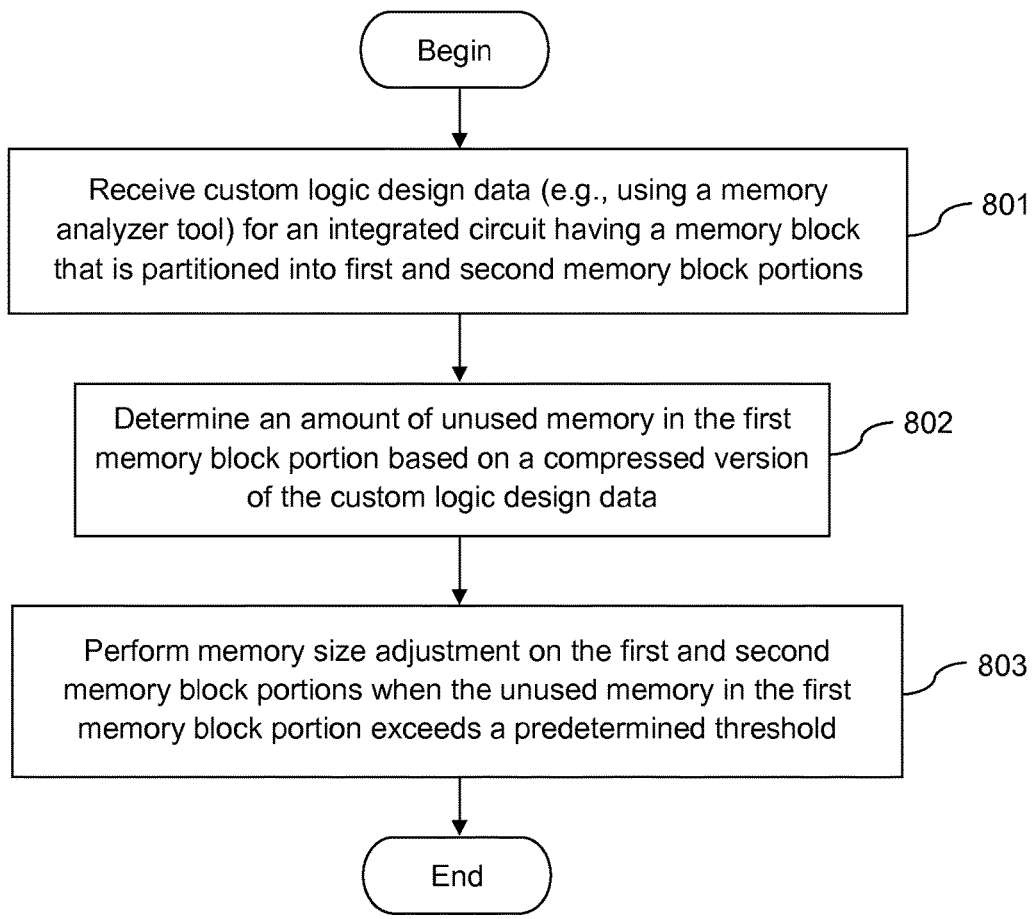
FIG. 8 is a flow chart of illustrative steps for performing memory size adjustment operations for a memory block in an integrated circuit in accordance with an embodiment of the present invention.

FIG. 8 is a flow chart of illustrative steps for performing memory size adjustment operations for a memory block in an integrated circuit in accordance with an embodiment of the present invention. It should be appreciated that the embodiment of FIGS. 6A, 6B, and 7 may be used as examples to explain the steps below. As described above in FIG. 6A, memory block 602 of integrated circuit 600 may be partitioned into two memory block portions 603 and 604, with each having a different memory type from each other. For example, memory block portion 603 may be a configuration flash memory (CFM) and memory block portion 604 may be a user flash memory (UFM). The integrated circuit 600 may be configured using a logic design data, which may be customized by a user (e.g., logic designer) to perform any of a variety of tasks and functions.

At step 801, custom logic design data for integrated circuit 600 is received using a memory analyzer tool (e.g., memory analyzer tool 700 of FIG. 7). In one embodiment, the memory analyzer tool may be part of computer aided design (CAD) tools 320 of FIG. 3.

At step 802, an amount of unused memory in the first memory block portion is determined based on a compressed version of the custom logic design data. To do so, the received custom logic design data is compiled (e.g., using CFM compiler tool 702 of FIG. 7) so that a compressed configuration data file output is generated. The compressed configuration data file output may determine the required CFM size and address.

When the unused memory in the first memory block portion exceeds a predetermined threshold, memory size adjustment is performed on the first and second memory block portions at step 803. For example, the predetermined threshold may be half the memory size/memory capacity (i.e., 1K word) of memory block portion 603. In one embodiment, the memory size adjustment involves repartitioning the memory block 602 into a first repartitioned and second repartitioned memory block portions (e.g., memory block portions 605 and 606 of FIG. 6A). A detailed description on step 803 is explained below in connection with FIG. 9.

Figure 9:
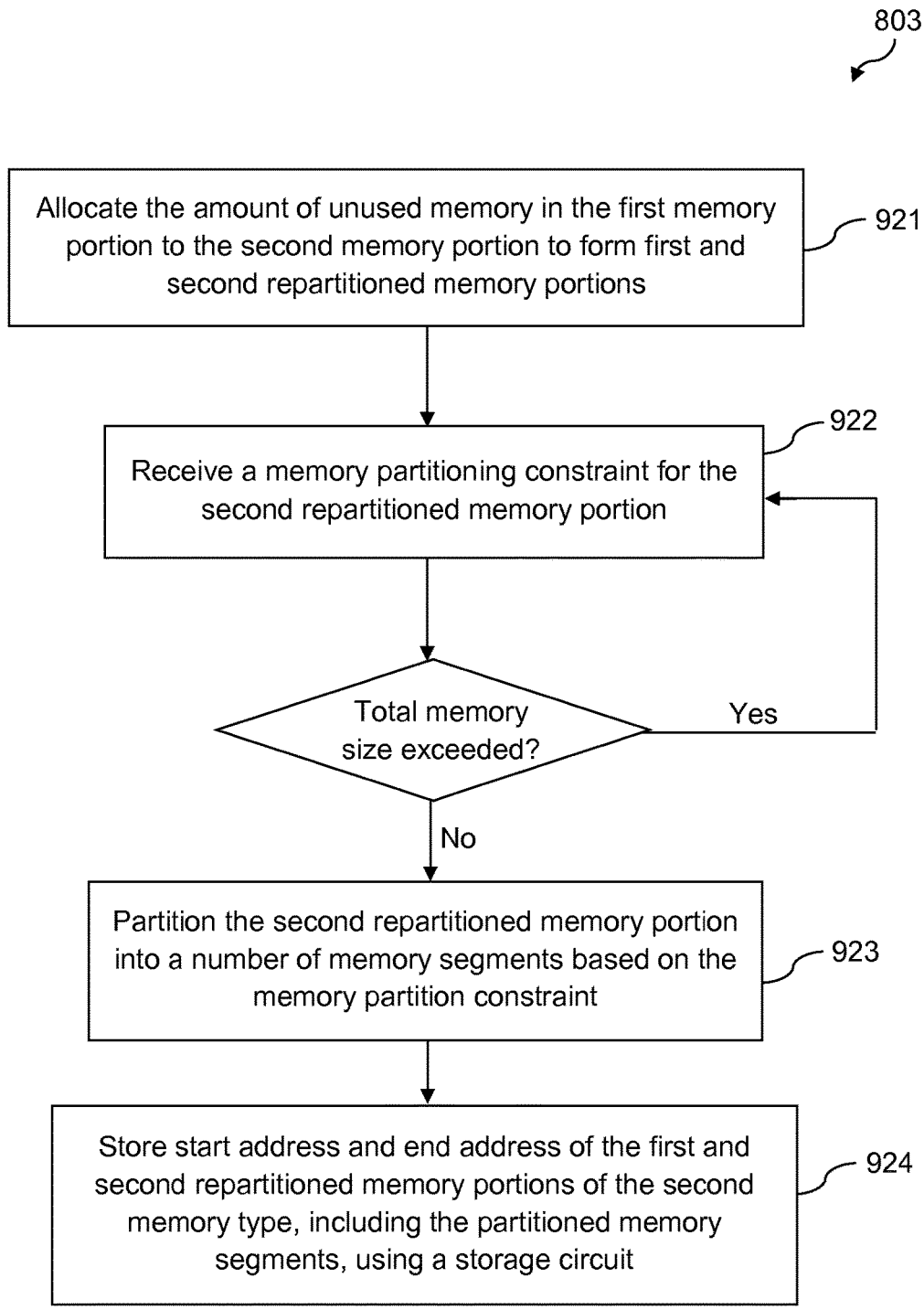
FIG. 9 shows illustrative steps for repartitioning the memory block into a first repartitioned memory block portion and a second repartitioned memory block portion based on the amount of unused memory in the first memory block portion in accordance with an embodiment of the present invention.

FIG. 9 shows illustrative steps for repartitioning a memory block into a first repartitioned memory block portion and a second repartitioned memory block portion based on the amount of unused memory in the first memory block portion in accordance with an embodiment of the present invention. It should be appreciated that the embodiment of FIGS. 6A, 6B, and 7 may be used as examples to explain the steps below.

At step 921, the amount of unused memory in the first memory block portion in the memory block is allocated to the second memory block portion to form the first and second repartition memory block portions. As shown in FIG. 6A, memory block 602 of integrated circuit 600 is repartitioned into memory block portions 605 and 606 when the determined amount of unused memory (e.g., memory portion 613B) in memory block portion 603 exceeds a predetermined threshold (e.g., half the memory size of memory block portion 603). The repartitioning of memory block portions 605 and 606 involves dynamically adjusting the memory boundaries between memory block portions 603 and 604 to allocate unused memory portion 613B of memory block portion 603 (e.g., CFM) to memory block portion 604 (e.g., UFM). This allows the unused memory portion to be utilized as part of the UFM.

At step 922, a memory partitioning constraint for the second repartitioned memory block portion is received. For example, as shown in FIG. 7, the memory partition constraint may include a number of memory segments to be partitioned in the second repartitioned memory block portion, memory size for each (or all) of the partitioned memory segments, and a start address for the second repartitioned memory block portion. A user may provide the memory partition constraint using UFM specification tool 703 of memory analyzer tool 700. The memory partitioning constraint is then evaluated to determine whether the provided information meets a predetermined memory size requirement of the memory block is met. For example, the predetermined memory size requirement may be a total amount of available memory size of memory block portion 606 in memory block 602.

When the memory partition constraint satisfies the total memory size of the memory block, the second repartitioned portion of the second memory type may be partitioned accordingly based on the memory partitioning constraint at step 923. Otherwise, step 922 is repeated until the predetermined memory size requirement of the memory block is met. Subsequently, the start address and end address of the first portion of the first and second repartitioned memory block portions, including the partitioned memory segments, are stored in a storage circuit (e.g., storage circuit 630 of FIG. 6A) of the integrated circuit at step 924.

For example, as shown in FIG. 7, the start address and the end address of the first repartitioned memory block portion (e.g., CFM 605 of FIG. 6B) is obtained based on the compiled CFM size of the first repartitioned portion of the first memory type (e.g., CFM size X of FIG. 7) and a user-defined CFM start address (e.g., CFM address Y of FIG. 7), respectively. Similarly, the start address and the end address for each number of partitioned UFM segments (e.g., UFM segments 654A, 654B, 654C, and 654D of FIG. 6B) is obtained in sequence, based on the size of each UFM segment (e.g., UFM size L) and a user-defined UFM start address (e.g., UFM start address M). In one embodiment, the start address and the end address of the CFM and UFM may be programmed into the CFM as part of hardware device settings of the integrated circuit.

The methods and apparatus described herein may be incorporated into any suitable circuit. For example, the methods and apparatus may be incorporated into numerous types of devices such as microprocessors or other integrated circuits. Exemplary integrated circuits include multi-chip module, programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; IO circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The integrated circuit device can be used to perform a variety of different logic functions. For example, the integrated circuit device can be configured as a processor or controller that works in cooperation with a system processor. The integrated circuit device may also be used as an arbiter for arbitrating access to a shared resource in the data processing system. In yet another example, the integrated circuit device can be configured as an interface between a processor and one of the other components in the system. In one embodiment, the integrated circuit device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit, comprising:
   a memory block that is partitioned into first and second memory block portions, wherein the first memory block portion includes memory elements of a first memory type, wherein the second memory block portion includes memory elements of a second memory type, and wherein the memory elements of the first type comprise configuration flash memory that stores configuration bits; and
   a control circuit that receives configuration data, wherein the configuration data includes memory partitioning information for repartitioning the memory elements of the first and second types in the memory block into first and second repartitioned memory block portions.

2. The integrated circuit defined in claim 1, wherein the memory partitioning information includes information on the amount of unused memory in the first memory block portion that is derived from the first memory block portion during a design compilation operation of the integrated circuit.

3. The integrated circuit defined in claim 2, wherein the unused memory of the first memory block portion is allocated to the second memory block portion.

4. The integrated circuit defined in claim 3, wherein the first repartitioned memory includes the first memory block portion minus the unused memory, and wherein the second repartitioned memory block portion includes the second memory block portion and the unused memory.

5. The integrated circuit defined in claim 4, wherein the memory partitioning information further includes a memory partitioning constraint for the second repartitioned memory block portion, and wherein the memory partitioning constraint specifies a start address for the second repartitioned memory block portion.

6. The integrated circuit defined in claim 5, wherein the memory partitioning constraint further includes at least one memory segment to be partitioned in the second repartitioned memory block portion.

7. The integrated circuit defined in claim 6, wherein the at least one memory segment is assigned a memory segment address range based on the start address of the second repartitioned memory block portion.

8. The integrated circuit defined in claim 6, further comprising:
a storage circuit that stores memory address data associated with the first repartitioned memory block portion and the second repartitioned memory block portion, including the at least one memory segment to be partitioned in the second repartitioned memory block portion.

9. The integrated circuit defined in claim 1, wherein the memory elements of the second type comprise user flash memory for storing user data.

10. A method for using a computer-aided design tool implemented on computing equipment to configure an integrated circuit device having a memory block that is divided into a first memory block portion and a second memory block portion, the method comprising:
with the computer-aided design tool, generating configuration data for the integrated circuit device and compressing the configuration data, wherein the first memory block portion is used to store the compressed configuration data;
with the computer-aided design tool, determining whether unused memory is present in the first memory block portion by analyzing the compressed configuration data; and
in response to determining that the unused memory is present in the first memory block portion, adjusting the size of the first memory block portion and the size of the second memory block portion.

11. The method defined in claim 10, wherein adjusting the size of each of the first and second memory block portions comprises allocating the unused memory of the first memory block portion to the second memory block portion.

12. The method defined in claim 11, further comprising:
with the computer-aided design tool, receiving a user input that specifies a memory partition constraint for the second memory block portion, wherein the memory partition constraint includes a start address for the second memory block portion and at least one memory segment for the second memory block portion.

13. The method defined in claim 12 further comprising:
with the computer-aided design tool, determining whether the memory partition constraint for the second memory block portion meets a predetermined memory size requirement of the first and second memory block portions.

14. A method for configuring an integrated circuit, comprising:
receiving custom logic design data for the integrated circuit having a memory block that is partitioned into a first portion of a first memory type and a second portion of a second memory type that is different than the first memory type;
determining an amount of unused memory in the first portion of the first memory type by analyzing the custom logic design data; and
in response to determining that the amount of unused memory exceeds a predetermined threshold, repartitioning the memory block into a first repartitioned portion of the first memory type and a second repartitioned portion of the second memory type, wherein the predetermined threshold is a fraction of the memory block.

15. The method defined in claim 14, wherein the repartitioning comprises allocating the first portion of the first memory type without the unused memory into the first repartitioned portion of the first memory type, wherein the first repartitioned portion of the first memory type is used to store static configuration data, and wherein the second repartitioned portion of the second memory type is used to store user data.

16. The method defined in claim 15, wherein the repartitioning further comprises allocating the second portion of the second memory type and the unused memory of the first portion of the first memory type into the second repartitioned portion of the second memory type.

17. The method defined in claim 16, further comprising:
receiving a user input from a user interface, wherein the user input includes a memory partition constraint for the second repartitioned portion of the second memory type.

18. The method defined in claim 17, wherein the memory partition constraint includes a number of memory partitions having a size, the method further comprising:
determining whether the size of the number of memory partitions meets a predetermined memory size requirement of the memory block.

19. The method defined in claim 18, further comprising:
partitioning the second repartitioned portion of the second memory type into at least one partitioned segment based on the memory partition constraint in response to determining that the size of the number of memory partitions meets the predetermined memory size requirement of the memory block.

20. The method defined in claim 19, wherein the memory partition constraint further includes an entry point address for the second repartitioned portion of the second memory type, and wherein the method comprises assigning a segment address range for the at least one partitioned segment based on the entry point address of the second repartitioned portion of the second memory type.

* * * * *